US009965024B2

(12) United States Patent
Baldwin et al.

(10) Patent No.: US 9,965,024 B2
(45) Date of Patent: May 8, 2018

(54) OVERRIDING FEATURE TO UNBLOCK CONTACTS IN A PORTABLE DEVICE DURING AN ENERGY SAVING MODE OF THE PORTABLE DEVICE (71) Applicant: International Business Machines Corporation, Armonk, NY (US)

(72) Inventors: Duane M. Baldwin, Mantorville, MN (US); Sandeep Bazar, Warangal (IN); Sandeep R. Patil, Pune (IN); Sachin C. Punadikar, Pune (IN)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 14/955,667

(22) Filed: Dec. 1, 2015

(65) Prior Publication Data
US 2017/0153694 A1 Jun. 1, 2017

(51) Int. Cl.
*G06F 1/32* (2006.01)
*H04W 60/00* (2009.01)
*G01R 31/36* (2006.01)
*H04W 4/22* (2009.01)
*H04W 76/00* (2009.01)
*H04M 1/73* (2006.01)

(52) U.S. Cl.
CPC .......... *G06F 1/3296* (2013.01); *G06F 1/3212* (2013.01); *G01R 31/3689* (2013.01); *H04M 1/73* (2013.01); *H04W 4/22* (2013.01); *H04W 60/00* (2013.01); *H04W 76/007* (2013.01)

(58) Field of Classification Search
CPC ....... H04W 4/22; H04W 76/007; H04W 4/06; H04W 60/00; G06F 1/1698; G06F 21/88; G06F 2221/2111; G06F 1/3296; G06F 1/3212; G08B 25/016; H04M 1/73; G01R 31/3689; G06R 31/3689
See application file for complete search history.

(56) References Cited

U.S. PATENT DOCUMENTS

| 6,345,180 B1 * | 2/2002 | Reichelt ............ H04W 52/0277 455/343.5 |
| 6,668,179 B2 * | 12/2003 | Jiang ................. H04W 52/0277 455/404.1 |
| 8,270,938 B2 | 9/2012 | Flippo et al. |
| 8,340,633 B1 * | 12/2012 | Rege ....................... H04W 4/26 455/405 |

(Continued)

*Primary Examiner* — Terrell S Johnson
(74) *Attorney, Agent, or Firm* — William H. Hartwell (57) ABSTRACT A method for efficient battery usage in for portable devices. The method includes a service provider receiving a communication associated with a first device and a second device, wherein one of the first device and the second device is a sender of the communication and the other of the first device and the second device is an intended recipient of the communication. The service provider then determines that the first device is operating in an energy saving mode. The service provider may also determine that an emergency communication override feature for the first device has not been enabled. Upon determining that the first mobile device is operating in an energy saving mode and that an emergency communication override feature for the first device has not been enabled, the service provider determines not to send the communication to the intended recipient of the communication.

11 Claims, 7 Drawing Sheets (56) References Cited

U.S. PATENT DOCUMENTS

| | | |
|---|---|---|
| 8,433,279 B2 | 4/2013 | Wu et al. |
| 8,913,994 B2 | 12/2014 | Edwards et al. |
| 9,380,608 B1* | 6/2016 | Bowles ................ H04M 3/5116 |
| 2003/0003972 A1* | 1/2003 | Sabat .................... H04M 1/677 |
| | | 455/574 |
| 2005/0096102 A1* | 5/2005 | Mock .................. H04W 52/265 |
| | | 455/574 |
| 2006/0178129 A1 | 8/2006 | Appaji |
| 2008/0311961 A1* | 12/2008 | Cotevino ................ H04W 4/16 |
| | | 455/574 |
| 2010/0273443 A1* | 10/2010 | Forutanpour ........... H04L 51/02 |
| | | 455/404.1 |
| 2011/0248863 A1* | 10/2011 | Johnson ............... G08B 27/006 |
| | | 340/686.1 |
| 2012/0238235 A1* | 9/2012 | Lee ........................ H04W 4/06 |
| | | 455/404.2 |
| 2012/0239949 A1* | 9/2012 | Kalyanasundaram |
| | | ............................ G06F 1/3212 |
| | | 713/320 |
| 2013/0315383 A1* | 11/2013 | Lieu ........................ H04W 4/22 |
| | | 379/39 |

* cited by examiner

OVERRIDING FEATURE TO UNBLOCK CONTACTS IN A PORTABLE DEVICE DURING AN ENERGY SAVING MODE OF THE PORTABLE DEVICE

BACKGROUND

The present invention relates generally to the field of portable devices, and more particularly to efficient battery use during low battery life situations.

Generally speaking, battery life is the period of time a battery powered device can operate on a single charge of a rechargeable battery. Some existing battery life saving features include: (i) a user manually monitoring cellular signal strength to prevent a portable device from constantly searching for a signal, (ii) a user manually turning off application notifications, (iii) a user manually changing the display settings to reduce the brightness (i.e., dim the screen) and turn the display off when not in use, (iv) a user manually disabling Bluetooth for any unnecessary accessories, and (v) a user manually changing synch settings on email to stop or reduce the number of times a portable device synchs with an email server.

SUMMARY

Embodiments of the present invention disclose a method, computer program product, and system for efficient battery usage in for portable devices. The method includes a service provider receiving a communication associated with a first device and a second device, wherein one of the first device and the second device is a sender of the communication and the other of the first device and the second device is an intended recipient of the communication. The service provider then determines that the first device is operating in an energy saving mode. The service provider may also determine that an emergency communication override feature for the first device has not been enabled. Upon determining that the first mobile device is operating in an energy saving mode and that an emergency communication override feature for the first device has not been enabled, the service provider determines not to send the communication to the intended recipient of the communication.

DETAILED DESCRIPTION

Embodiments in accordance with the present invention recognize that a key element for responding to emergencies is communication. People carry portable devices, such as smart phones, at all times of the day. These portable devices need to be used efficiently in case of emergencies. An emergency situation can be specific to a person or to a group of people, such as when a person or a group of people: are involved in an accident, are involved in a robbery, are located at an unknown place, need help travelling to a safe place, or are affected by a natural disaster (such as a flood, a storm, an earthquake, etc). In such scenarios it becomes important for those affected by the emergency to reach out to the right persons for help.

Most modern portable devices require a battery to operate properly. These portable devices, also known as smart devices, typically come with rich sets of features, including hardware features such as GPS sensors and software features such as applications that manage contact lists, map applications, messaging applications, etc. Due to these heavy sets of features, the battery life (that is, the amount of time that it takes for the battery to lose a charge) of such devices tends to diminish very quickly. However, if the battery of a device loses its charge in an emergency situation, the owner of the device will be unable to use the device to make emergency-related communications. As such, in order to enable use of a portable device for emergency situations, the battery charge (also referred to as "battery power") of the portable device should not be allowed to completely drain. In many cases, a user of a portable device monitors battery usage to avoid such a situation; however, in a scenario where a first user of a portable device might need to call someone for help, a second user being called by the first user may not be aware of the first user's emergency situation and may not provide due attention to the call due to battery usage.

Nearly every operation performed by a smart device consumes some amount of energy (or "power"). For example, energy is used even when rejecting unwanted calls, leading to a reduction in battery power. As such, there is a need for a smarter and efficient method by which battery life of a smart device can be extended to allow the smart device to remain functional during an emergency situation (including an emergency situation affecting the user of the smart device and/or an emergency situation affecting individuals who are attempting to contact the user of the smart device). Embodiments of the present invention can preserve battery power for smart devices of users that are sending and receiving communications, such as calls or messages, during periods where the smart devices may be low on power.

Figure 1:
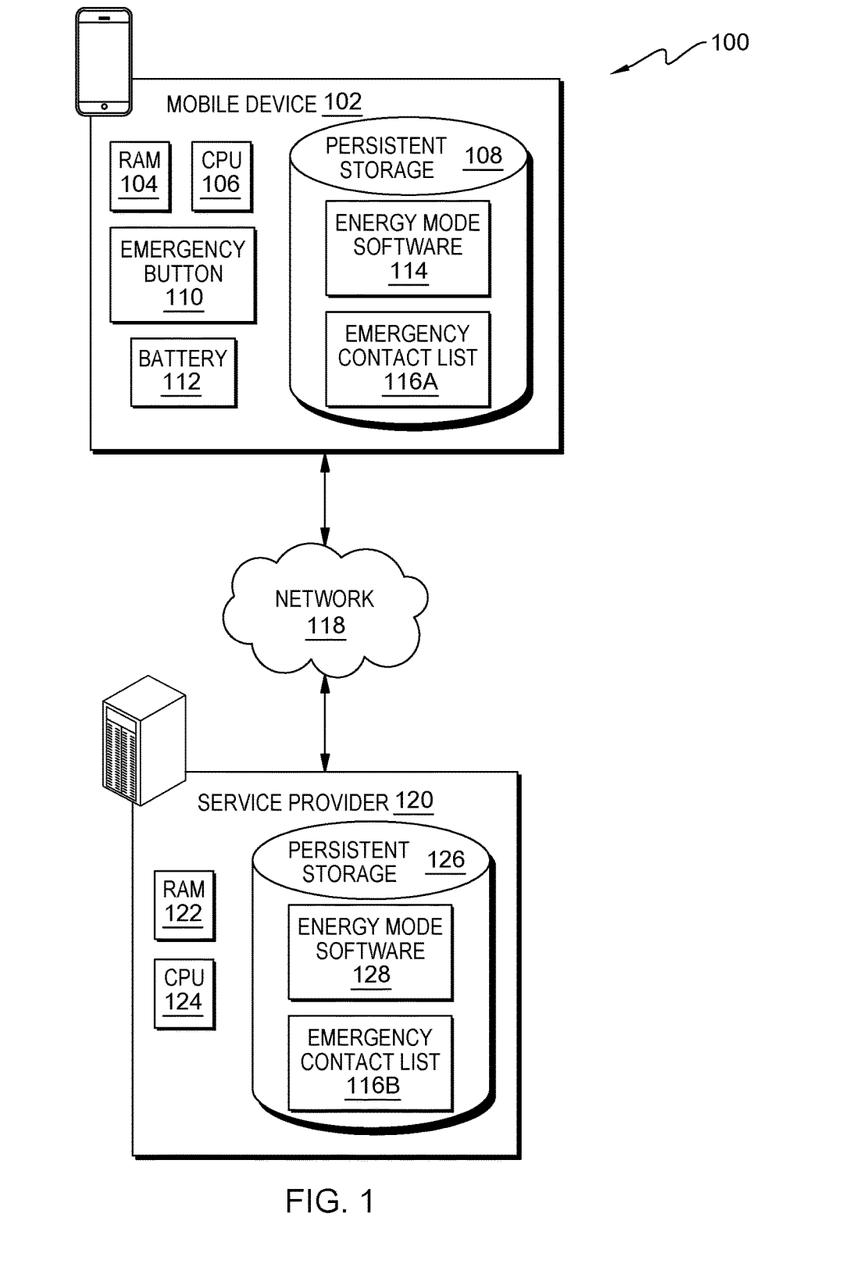
FIG. 1 is a functional block diagram illustrating a data communication environment, in an embodiment in accordance with the present invention.

Embodiments in accordance with the present invention will now be described in detail with reference to the Figures. FIG. 1 is a functional block diagram, generally designated 100, illustrating a data communication environment, in an embodiment in accordance with the present invention.

Data communication environment 100 includes mobile device 102 and service provider 120, interconnected over network 118. Mobile device 102 includes random access memory (RAM) 104, central processing unit (CPU) 106, persistent storage 108, emergency button 110 and battery 112. Mobile device 102 may be a Web server, or any other electronic device or computing system, capable of processing program instructions and receiving and sending data. In some embodiments, mobile device 102 may be a laptop computer, a tablet computer, a netbook computer, a personal computer (PC), a desktop computer, a personal digital assistant (PDA), a smart phone, or any programmable electronic device capable of communicating over a data connection to network 118. In other embodiments, mobile device 102 may represent server computing systems utilizing multiple computers as a server system, such as in a distributed computing environment. In general, mobile device 102 is representative of any electronic devices or combinations of electronic devices capable of executing machine-readable program instructions and communicating with service provider via network 118 and with various components and devices (not shown) within data communication environment 100.

Mobile device 102 includes persistent storage 108. Persistent storage 108 may, for example, be a hard disk drive. Alternatively, or in addition to a magnetic hard disk drive, persistent storage 108 may include a solid state hard drive, a semiconductor storage device, read-only memory (ROM), erasable programmable read-only memory (EPROM), flash memory, or any other computer-readable storage medium that is capable of storing program instructions or digital information. Energy mode software 114 and emergency contact list 116A are stored in persistent storage 108, which also includes operating system software, as well as software that enables mobile device 102 to detect and establish a connection to service provider 120, and communicate with at least one or more computing devices (not shown) of data communication environment 100 over a data connection on network 118.

Energy mode software 114 is stored in persistent storage 108. Energy mode software 114 is a computer program, or a set of programs, that monitors the remaining power of battery 112 to determine if mobile device 102 should be placed in an energy saving mode when the remaining battery life of battery 112 falls below a predetermined threshold. For example, the remaining battery life for battery 112 of mobile device 102 drops below 20%. Energy mode software 114 notifies service provider 120 of the threshold event so that telephone calls and other data may be blocked if the call is not an emergency call or if the caller is not on emergency contact list 116A. In other example embodiments, service provider 120 may inform users of incoming calls, or short message service (SMS) messages, to mobile device 102, that the call cannot be placed due to mobile device 102 operating in energy saving mode.

Emergency contact list 116A is also stored in persistent storage 108. Emergency contact list 116A is used by mobile device 102 to list or categorize contacts to allow when operating in energy saving mode. For example, a user may define the emergency contact list by adding close family members, such as contacts for a mother and/or father. Other numbers that may be included in emergency contact list 116A may include utility numbers for law enforcement and/or fire rescue services. In one example embodiment, mobile device 102 and/or energy mode software 114 may periodically sync emergency contact list 116A with service provider 120 to ensure the most recent revision of emergency contact list 116A is stored with service provider 120. In one example embodiment, a user may use energy mode software 114 (via a user interface not shown) of mobile device 102 to add contacts to emergency contact list 116A.

Emergency button 110, also referred to as an emergency communication override, is included in mobile device 102 and is used by a user to text or place a call to a contact in emergency contact list 116A. When a user presses emergency button 110, mobile device 102 re-enables services required to gather current attributes, such as the current global positioning system (GPS) coordinates of mobile device 102, altitude of mobile device 102, and to make calls to contacts in emergency contact list 116A. In other example embodiments, energy mode software 114 may send out a SOS message via messaging applications when a user presses emergency button 110. SOS is the international Morse code distress signal comprised by three dots, followed by three dashes, then again by three dots. For example, ( . . . - - - . . . ). In other example embodiments, energy mode software 114 may monitor battery 112 to determine the minimum power required to send location information via a messaging application. When battery 112 reaches the minimum power threshold to send a text, energy mode software 114 may send the last known GPS location of mobile device 102 to one or more contacts in emergency contact list 116A. In other example embodiments, a user may add contacts to a replica copy of emergency contact list 116A using a computing device (not shown) within data communication environment 100 and then upload the replica of emergency contact list 116A to mobile device 102.

Mobile device 102 includes battery 112. Battery 112 may be a nickel-metal hydride battery, lithium-ion battery, or a lithium-ion polymer battery. A nickel-metal hydride battery, abbreviated (NiMH) or (Ni-MH), is a common consumer rechargeable battery that can have two to three times the capacity of an equivalent size nickel-cadmium cell, and its energy density can approach that of a lithium-ion battery. A lithium-ion battery (sometimes Li-ion battery or LIB) is a member of a family of rechargeable battery types in which lithium ions move from the negative electrode to the positive electrode during discharge and back when charging. A lithium polymer battery, also referred to as lithium-ion polymer battery (abbreviated variously as LiPo, LIP, Li-poly and others), is a rechargeable battery that is light in weight, offers slightly higher energy density than Li-ion at slightly higher cost, and can be made in any shape. In general, battery 112 is representative of any battery used, or may be used, in any portable device within data communication environment 100.

Figure 7:
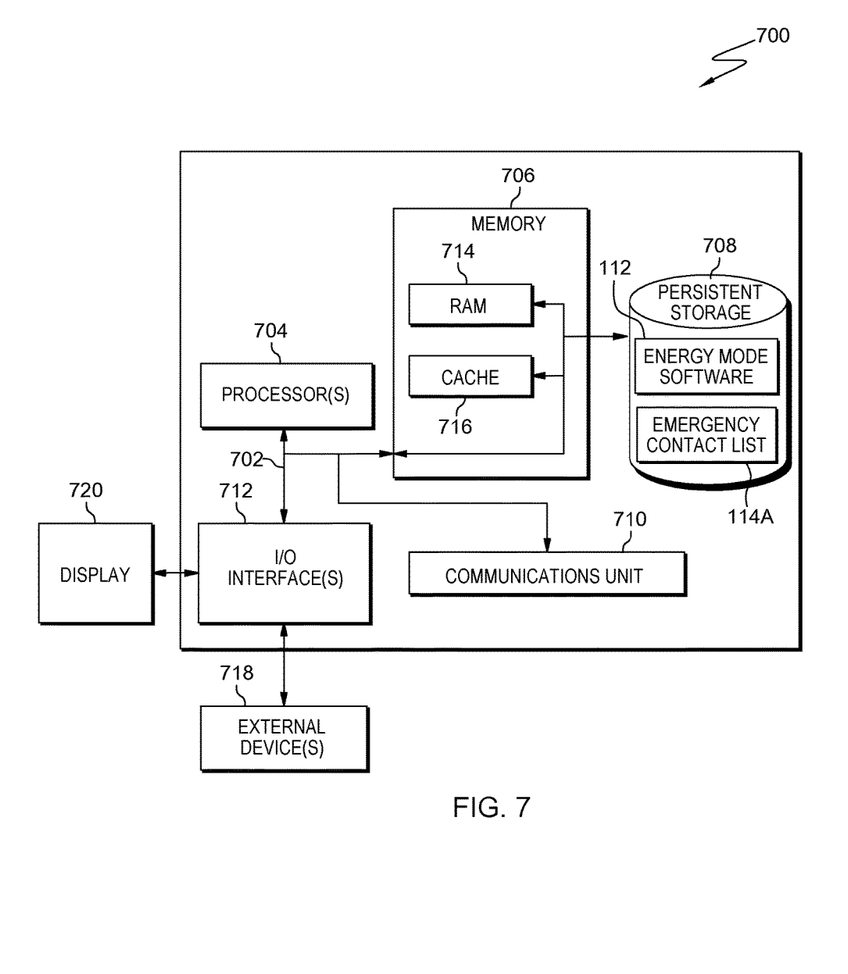
FIG. 7 depicts a block diagram of components of the mobile device executing the energy mode software, in an embodiment in accordance with the present invention.

Mobile device 102 may include internal and external hardware components, as depicted and described in further detail with respect to FIG. 7.

In FIG. 1, network 118 is shown as the interconnecting fabric between mobile device 102 and service provider 120. In practice, the connection may be any viable data transport network, such as, for example, a LAN or WAN. Network 118 can be for example, a local area network (LAN), a wide area network (WAN) such as the Internet, or a combination of the two, and include wired, wireless, or fiber optic connections. In general, network 118 can be any combination of connections and protocols that will support communications between mobile device 102 and service provider 120.

Service provider 120 is included in data communication environment 100 and contains RAM 122, CPU 124, and persistent storage 126. Service provider 120 may be a Web server, or any other electronic device or computing system, capable of processing program instructions and receiving and sending data. In some embodiments, service provider 120 may be a laptop computer, a tablet computer, a netbook computer, a personal computer (PC), a desktop computer, a personal digital assistant (PDA), a smart phone, or any programmable electronic device capable of communicating over a data connection to network 118. In other embodiments, service provider 120 may represent server computing systems utilizing multiple computers as a server system, such as in a distributed computing environment. In general, service provider 120 is representative of any electronic devices or combinations of electronic devices capable of executing machine-readable program instructions and communicating with mobile device 102 via network 118 and with various components and devices (not shown) within data communication environment 100.

Service provider 120 includes persistent storage 126. Persistent storage 126 may, for example, be a hard disk drive. Alternatively, or in addition to a magnetic hard disk drive, persistent storage 126 may include a solid state hard drive, a semiconductor storage device, read-only memory (ROM), erasable programmable read-only memory (EPROM), flash memory, or any other computer-readable storage medium that is capable of storing program instructions or digital information. Energy mode software 128 and emergency contact list 116B are stored in persistent storage 126, which also includes operating system software, as well as software that enables service provider 120 to detect and establish a connection to mobile device 102, and communicate with other computing devices (not shown) of data communication environment 100 over a data connection on network 118. In other example embodiments, energy mode software 128 and emergency contact list 116B may be stored on one or more computing devices (not shown) within data communication environment 100.

Energy mode software 128 is stored in persistent storage 126. Energy mode software 128 is a computer program, or a set of programs that monitors for the indication that mobile device 102 has reached or passed a determined threshold for remaining battery life of battery 112. Upon receiving an indication that mobile device 102 is running in energy saving mode, Energy mode software 128 may reject incoming and/or outgoing calls and data to mobile device 102 that are not registered in emergency contact list 116B. Energy mode software 128 may reject calls that are not listed in emergency contact list 116B until an indication is received from mobile device 102 that the power level for battery 112 has gone above the determined threshold, or exceeded a second threshold for a maximum charge.

Emergency contact list 116B is also stored in persistent storage 126. In one example embodiment, emergency contact list 116B may be a replica of emergency contact list 116A. In other example embodiments, emergency contact list 116B may be the only emergency contact list defined for mobile device 102 and stored in persistent storage 126. In other example embodiments, emergency contact list 116B may be received from mobile device 102 prior to battery 112 reaching the determined threshold for remaining battery life.

Figure 2:
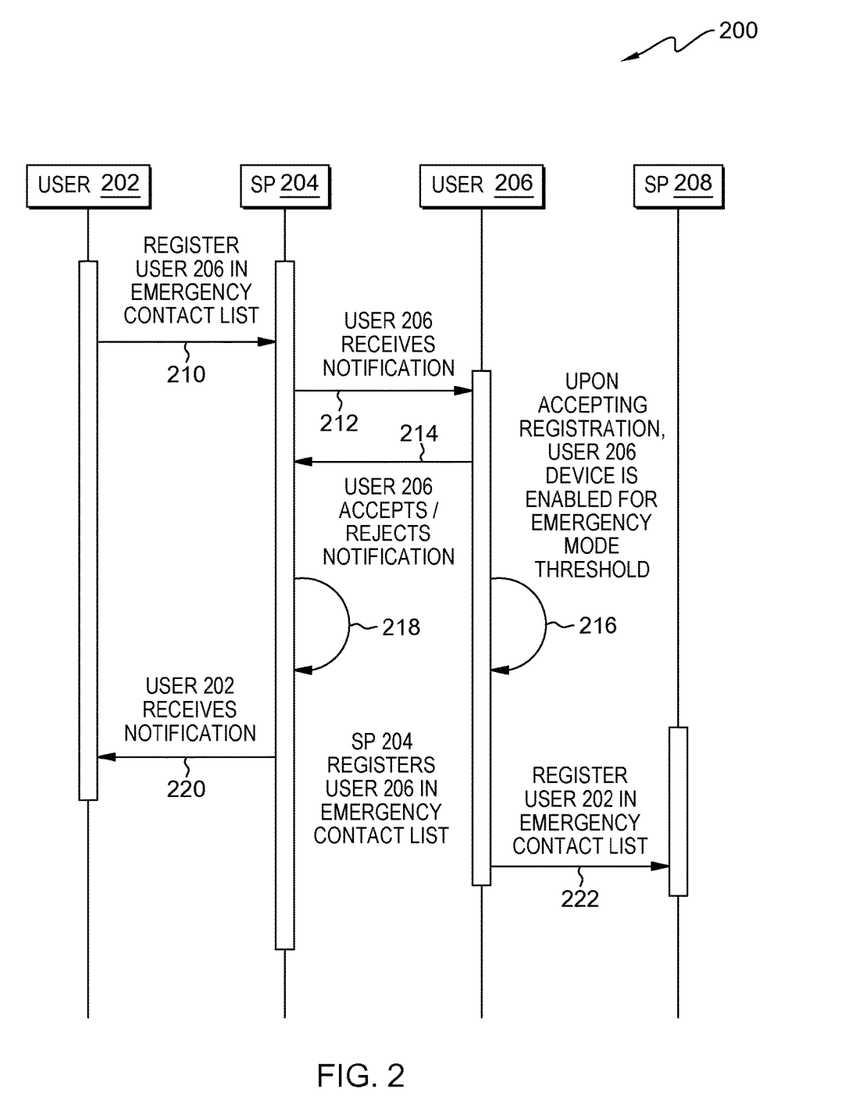
FIG. 2 is a flowchart depicting operational steps of emergency contact registration with service providers, on a plurality of mobile devices within the data communication environment of FIG. 1, for registering emergency numbers for a mobile device, in an embodiment in accordance with the present invention.

FIG. 2 is a flowchart, generally designated 200, depicting operational steps of emergency contact registration with service providers, on a plurality of mobile devices within the data communication environment of FIG. 1, for registering emergency numbers for a mobile device, in an embodiment in accordance with the present invention. In this example, a first user registers a second user's number to be called as an emergency number. The second user's device, upon accepting the registration, will be enabled for emergency mode. At the same time the second user's device will register the first user's number with the second user's service provider indicating the first user can make a call to second user, while second user's device is in an emergency mode. Also, the second user may register additional choices of numbers, to be called by in emergency mode. This way the service provider is made aware of who can call the second user while in emergency mode. Now, even though the first user has been registered for calling the second user, the second user will not receive any calls from the first user via the service provider unless the first user makes a call after pressing the emergency button. This ensures that even though the number is registered for calling a particular device, the number cannot be called for any non-emergency calls.

In an example embodiment, a first user (e.g., USER 202), using a mobile device representative of mobile device 102, registers an identifier, also referred to as contact information, of a second user (e.g., USER 206), also using a mobile device representative of mobile device 102, to allow phone calls and selected data to be transmitted and/or received between the mobile device of USER 202 and the mobile device of USER 206 when the mobile device of USER 202 and/or the mobile device of USER 206 is operating in energy saving mode.

In step 210, USER 202 registers the contact information of USER 206 in an emergency contact list with service provider (SP) 204. For example, USER 202 enters the contact information of USER 206 in emergency contact list 116A using a user interface on mobile device 102. In other example embodiments, USER 202 may import an emergency contact list stored on another device within data communication environment 100.

In step 212, USER 206 receives a notification from SP 204 indicating that USER 202 wishes to add USER 206 to emergency contact list 116A. In one example embodiment, SP 204 may send USER 206 a text message notification informing USER 206 that USER 202 would like to add USER 206 as an emergency contact. The text message may ask USER 206 to reply to the message to indicate whether USER 206 accepts or rejects the request. In other example embodiments, SP 204 may call USER 206 using an automated voice system to informing USER 206 that USER 202 would like to add USER 206 as an emergency contact.

In step 214, USER 206 accepts or rejects the registration request from SP 204. If USER 206 rejects the request to add USER 206 as an emergency contact, SP 204 sends USER 202 a response notification as shown in step 220. In other example embodiments, USER 206 may not respond to the request and SP 204 may timeout and send USER 206 a request again, or reject the request and notify USER 202 of the timeout. If USER 206 accepts (i.e., confirms), the request to add USER 206 as an emergency contact, USER 206's device is enabled for energy saving mode by setting a battery threshold level (e.g., 20%), and an instance of energy mode software 114 is created to begin monitoring the remaining battery life of battery 112 as depicted in step 216.

In step 218, upon USER 206 accepting the registration request from SP 204 indicating that USER 202 wishes to add USER 206 to emergency contact list 116A, SP 204 registers USER 206 as an emergency contact in emergency contact list 116B. For example, SP 204 adds the contact information for USER 206 to emergency contact list 116B. In other example embodiments, upon adding the contact information for USER 206 to emergency contact list 116B, SP 204 may synchronize emergency contact list 116B with emergency contact list 116A of USER 202's mobile device.

In step 220, SP 204 sends USER 202 a response notification indicating USER 206 accepted the request and enables USER 202's mobile device for energy saving mode by setting a battery threshold level (e.g., 20%), and an instance of energy mode software 114 is created to begin monitoring the remaining battery life of battery 112 as depicted in step 220. In other example embodiments, an instance of energy mode software 114 may be created prior to receiving the response from USER 206.

In step 222, SP 208 is informed that USER 202 can call USER 206 in case of emergency while USER 206 is operating in energy saving mode. In one example embodiment, USER 206 may be able to adjust the threshold setting for USER 206's mobile device independently from the threshold that USER 202 initially set. For example, USER 206 may want a threshold level of 25%. In this scenario, the mobile device for USER 202 will switch to energy saving mode when battery 112 reaches the 20% threshold, while the mobile device of USER 206 will switch to energy saving mode when battery 112 reaches the 25% threshold. In another example embodiment, USER 206 may also register additional contacts of USER 206's choice for being called in emergency. For example, after accepting the request to add USER 202 to emergency contact list 116A on the mobile device of USER 206, USER 206 may additionally add contacts for family members, such as a mother or a father, to emergency contact list 116A.

Figure 3:
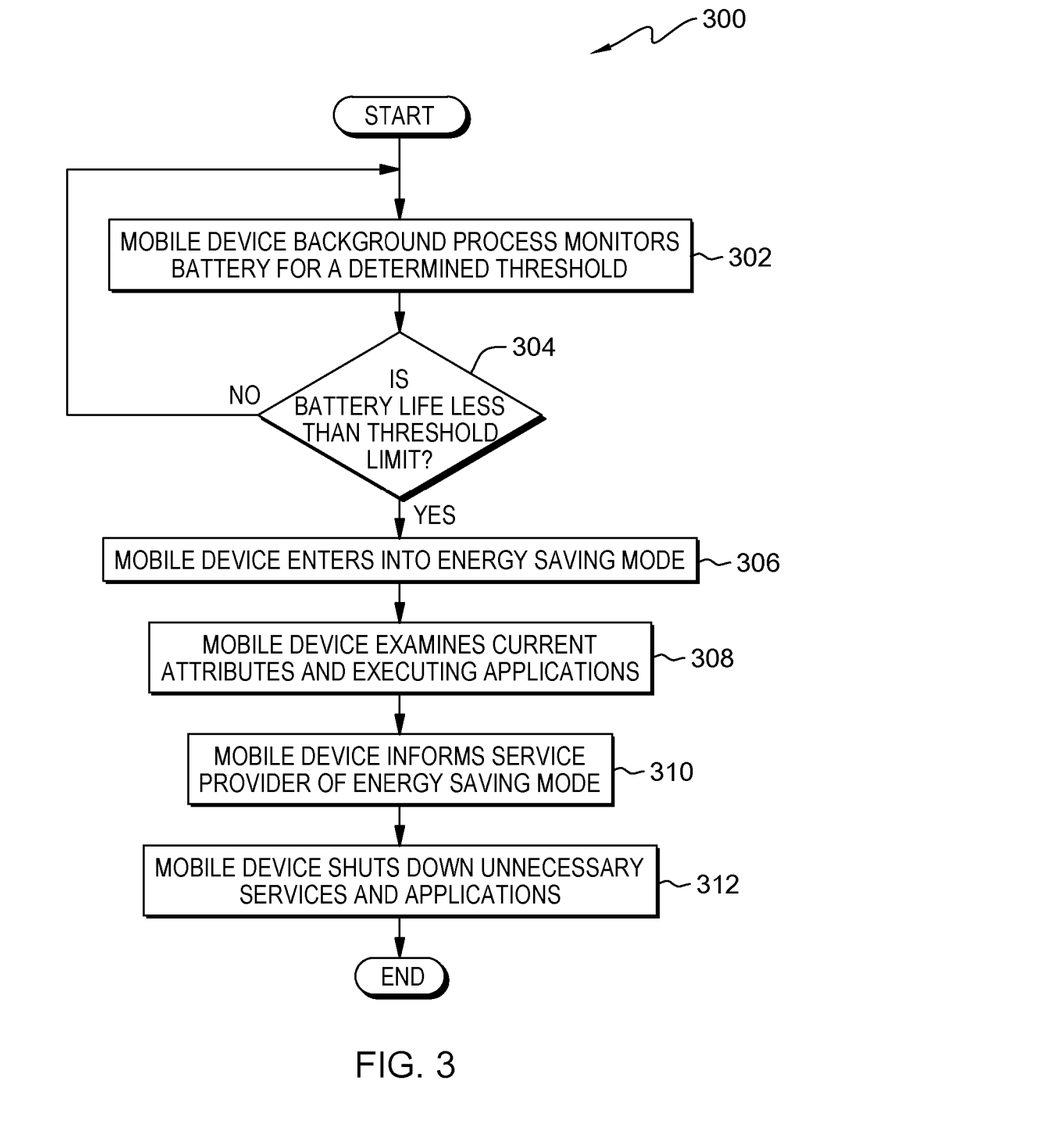
FIG. 3 is a flowchart depicting operational steps of energy mode software, for monitoring the battery life of a mobile device and taking steps when a determined threshold is reached, within the data communication environment of FIG. 1, in an embodiment in accordance with the present invention.

FIG. 3 is a flowchart, generally designated 300, depicting operational steps of energy mode software, for monitoring the battery life of a mobile device and taking steps when a determined threshold is reached within the data communication environment of FIG. 1, in an embodiment in accordance with the present invention. The mobile device, also referred to as a portable device, detects that its battery is going below certain threshold level (e.g., 20%), and switches over to bare minimum functionality mode, also referred to as energy saving mode or emergency mode. In energy saving mode, the functions provided will be those functions required for receiving calls and/or text messages in the event of an emergency. The mobile device will shut down all unwanted running processes/functionalities, other than those required to receive calls. The mobile device also carries an emergency button, that when pressed, will cause the mobile device to activate services required to gather the current details about location, altitude, etc. and provide a mechanism to make a call, thus saving on battery power by not running all the services all the time in emergency mode.

In an example embodiment, mobile device 102 instantiates a background process, also referred to as an instance, of energy mode software 114 to monitor battery 112 for a predetermined threshold as depicted in step 302. For example, a user of mobile device 102 uses energy mode software 114 to set a threshold of 20% where mobile device will enter into energy saving mode. In one example embodiment, the instance of energy mode software 114 may be manually executed by a user of mobile device 102. In other example embodiments, the instance of energy mode software 114 may be started after a user configuration setting in the operating system (OS) of mobile device 102 is turned on, or enabled. In general, energy mode software 114 may run as an application or as part of the OS on mobile device 102.

In decision step 304, energy mode software 114 determines if the battery life threshold limit has been reached or exceeded. For example, energy mode software 114 determines if the remaining battery life of battery 112 is less than 20% of the maximum power level of battery 112. If energy mode software 114 determines the remaining battery life of battery 112 is not less than the threshold limit ("No" branch, decision 304), energy mode software 114 continues to monitor the remaining power level of battery 112 as depicted step 302. If energy mode software 114 determines the remaining battery life of battery 112 is less than the threshold limit ("Yes" branch, decision 304), energy mode software 114 enters mobile device 102 into an energy saving mode as depicted step 306.

Energy mode software 114 then examines the current attributes, also referred to as device settings, and the current executing applications to create a checkpoint of the current GPS coordinates of mobile device 102 and to determine what applications and processes to shut down to conserve the remaining power of battery 112 as depicted in step 308. For example, upon examining the current attributes and executing applications, energy mode software 114 saves the current GPS location of mobile device 102. Additionally, energy mode software 114 determines that one or more game and photography applications, and one or more background processes not necessary for mobile device 102 to communicate with service provider 120 in an emergency situation are executing. In one example embodiment, energy mode software 114 may dim the display of mobile device 102 to help reduce the power consumption.

In step 310, energy mode software 114 informs service provider 120 that mobile device 102 is now operating in an energy saving mode. Service provider 120 then begins filtering calls and data destined to mobile device 102 to determine if the user placing the call, or sending the data, to mobile device 102 is in emergency contact list 116B. In one example embodiment, while in energy saving mode, mobile device 102 may add another mobile device that is not in emergency contact list 116A or 116B. For example, a user of mobile device 102 adds another contact to emergency contact list 116A while mobile device 102 is operating in energy saving mode. Energy mode software 114 may then send the new contact to service provider 120 to be added to emergency contact list 116B.

Energy mode software 114 then shuts down, or turns off, all unnecessary services and applications except what is required to place a call as depicted in step 312. For example, emergency mode software 114 shuts down the executing one or more game and photography applications, and the one or more background processes not necessary for mobile device 102 to communicate with service provider 120 in an emergency situation. In other example embodiments, energy mode software 114 may shut down, or disable the non-critical applications and background processes prior to notifying service provider 120.

Figure 4:
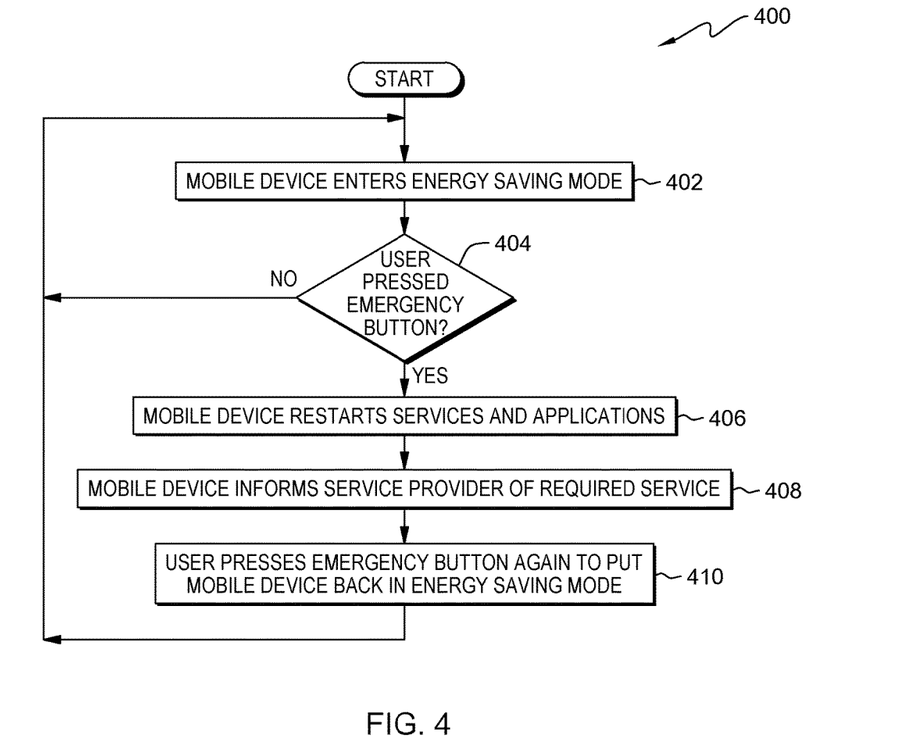
FIG. 4 is a flowchart depicting operational steps of energy mode software when a user presses an emergency button, on a mobile device that is running in energy saving mode within the data communication environment of FIG. 1, in an embodiment in accordance with the present invention.

FIG. 4 is a flowchart, generally designated 400, depicting operational steps of energy mode software when a user presses an emergency button, on a mobile device that is running in energy saving mode within the data communication environment of FIG. 1, in an embodiment in accordance with the present invention. Continuing the example embodiment of FIG. 3 where mobile device 102 is executing in energy saving mode, as depicted in step 402, a user of mobile device 102 presses emergency button 110 to place a call, or send a message, to another user in emergency contact list 116A.

In decision step 404, energy mode software 114 determines if a user has pressed emergency button 110 to make a phone call, or send data, while mobile device 102 is in energy saving mode. For example, a user of mobile device 102 needs to place a call to a person that is in emergency contact list 116A while mobile device 102 is in energy saving mode. The user presses emergency button 110 and the mobile communication feature is activated allowing the user to select the contact from emergency contact list 116A using a user interface (not shown). In other example embodiments, the user may use a voice activation feature of mobile device 102 to perform the equivalent of pressing emergency button 110. For example, a user may say "Emergency. Call Jane Doe". Upon registering the phrase "Emergency. Call Jane Doe", energy mode software 114 may activate the phone application or feature, and inform service provider 120 that the user requires phone service. Upon notifying service provider 120 of the request for telephone service, energy mode software 114 may look up "Jane Doe" in emergency contact list 116A then place the call to "Jane Doe".

If energy mode software 114 determines a user has not pressed emergency button 110 ("No" branch, decision 404), energy mode software 114 continues to operate mobile device 102 in energy saving mode as depicted in step 402. If energy mode software 114 determines a user has pressed emergency button 110 ("Yes" branch, decision 404), energy mode software 114 restarts services and/or applications required to place calls or send text messages to contacts in emergency contact list 116A as depicted in step 406. For example, the user may require to send a text message. Energy mode software 114 may then reactivate a messaging application so the user can send a message to another user in emergency contact list 116A.

In step 408, energy mode software 114 informs service provider 120 that the user of mobile device 102 requires telephone or data service. For example, energy mode software may send a notification with the type of service required. The user may then send a text message via the messaging application to the selected emergency contact. In other example embodiments, service provider 120 may not require a notification of service type, but only allow communication to users in emergency contact list 116B.

Upon placing a call and/or sending a message to a user in emergency contact list 116A, a user may press emergency button 110 again to place mobile device 102 back into energy saving mode as depicted in step 410. For example, the user may send a text message via the messaging application to the selected emergency contact, then upon sending the text message, they user may press emergency button 110 again to place mobile device 102 back into energy saving mode. In other example embodiments, energy mode software 114 may automatically place mobile device 102 back into energy saving mode upon sending the text message. In another example embodiment, energy mode software 114 may wait a configurable time limit to place mobile device 102 back into energy saving mode. For example, a user may configure a time period using energy mode software 114 via a mobile device 102 user interface (not shown), that specifies a time period energy mode software 114 will wait before placing mobile device 102 back into energy saving mode.

Figure 5:
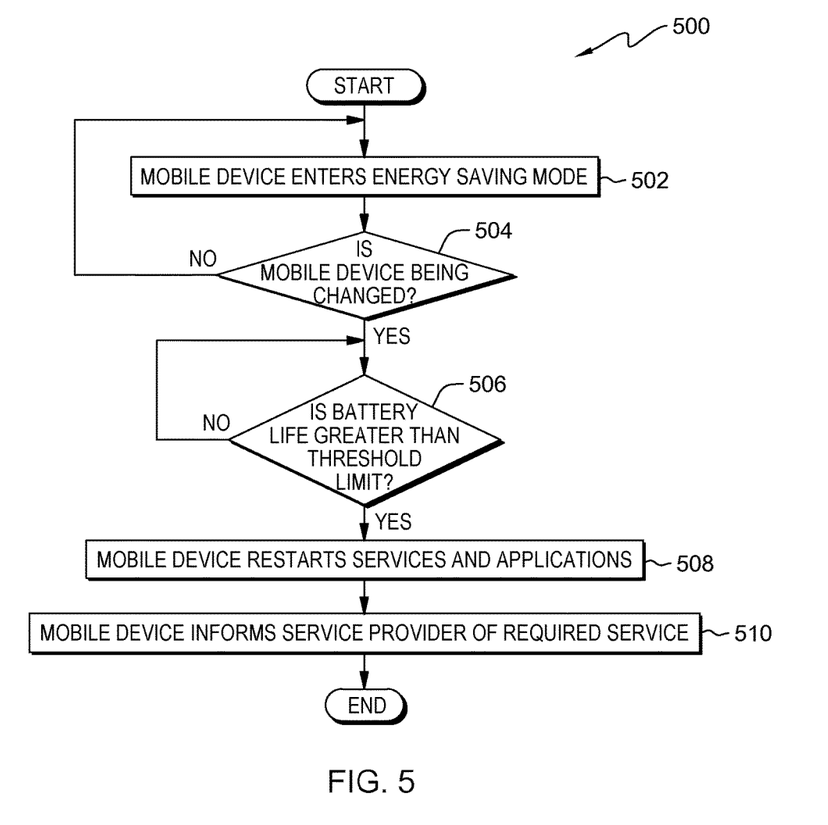
FIG. 5 is a flowchart depicting operational steps of energy mode software to determine if a battery is being charged, on a mobile device that is running in energy saving mode within the data communication environment of FIG. 1, in an embodiment in accordance with the present invention.

FIG. 5 is a flowchart, generally designated 500, depicting operational steps of energy mode software to determine if a battery is being charged, on a mobile device that is running in energy saving mode within the data communication environment of FIG. 1, in an embodiment in accordance with the present invention. Again continuing the example embodiment of FIG. 3 where mobile device 102 is executing in energy saving mode, as depicted in step 502, a user attaches a charging device, or places mobile device 102 in a docking station that charges battery 112. A battery charger, also referred to as a recharger, or charger, is a device used to put energy into a secondary cell or rechargeable battery by forcing an electric current through it. The charging protocol depends on the size and type of the battery being charged.

In decision step 504, energy mode software 114 determines if a user of mobile device 102 has attached a charger to mobile device 102 and battery 112. For example, once a user finds an energy source, the user may attach mobile device 102 to the charger to recharge battery 112 so the available power is greater than the energy saving mode threshold level. In one example embodiment, energy mode software 114, or service provider 120 may determine the nearest power source to mobile device 102 using the last known GPS coordinates that energy mode software saved upon placing mobile device 102 into energy saving mode. If energy mode software 114 determines mobile device 102 is not being charged ("No" branch, decision 504), energy mode software 114 continues to operate mobile device 102 in energy saving mode as depicted in step 502. If energy mode software 114 determines mobile device 102 is being charged ("Yes" branch, decision 504), energy mode software 114 determines if the power in battery 112 is greater than the threshold limit as depicted in decision step 506.

In decision step 506, energy mode software 114 determines if the power in battery 112 is greater than the threshold limit. For example, energy mode software 114 determines if the current battery life of battery 112 is greater than 20% of the maximum power level of battery 112. In one example embodiment, the energy of battery 112 may be measured by energy mode software 114 or another application executing on mobile device 102. In other example embodiments, energy mode software 114 may measure the energy of battery 112 by calculating how much energy has already been used. In general, the energy of battery 112 may be measured or calculated using known methods in the art.

If energy mode software 114 determines that the power in battery 112 is not greater than the threshold limit ("No" branch, decision 506), energy mode software 114 continues to check if the power in battery 112 has reached, or exceeded, the threshold limit for energy saving mode as depicted in decision step 506. If energy mode software 114 determines that the power in battery 112 is greater than the threshold limit ("Yes" branch, decision 506), energy mode software 114 restarts services and attributes, such as GPS features and normal running applications and/or processes of mobile device 102 as depicted in step 508. In other example embodiments, upon connecting mobile device 102 to a charger, energy mode software 114 may automatically restart services and attributes, such as GPS features and normal running applications and/or processes of mobile device 102.

In step 510, mobile device 102 informs service provider 120 that mobile device 102 is operating in a normal mode again. Service provider 120 may then stop filtering calls and data destined to mobile device 102 and allow all incoming and outgoing calls, as well as data, to/from mobile device 102. In one example embodiment, energy mode software 114 may have a "service provider notification" configuration setting that requires input from a user of mobile device 102 before notifying service provider 120. The "service provider notification" configuration setting may be set via a user interface (not shown) by a user of mobile device 102.

Figure 6:
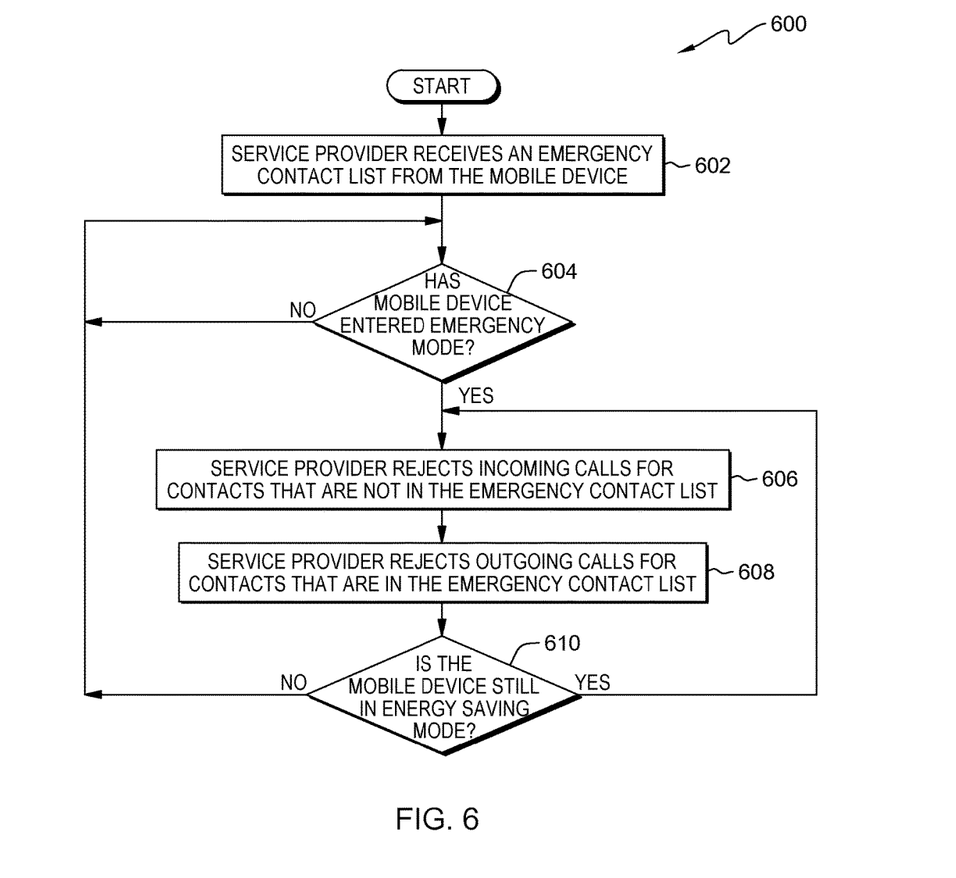
FIG. 6 is a flowchart depicting operational steps of a service provider receiving an emergency contact list from a mobile device and limiting data being sent or received from the mobile device while operating in energy saving mode, in an embodiment in accordance with the present invention.

FIG. 6 is a flowchart, generally designated 600, depicting operational steps of a service provider receiving an emergency contact list from a mobile device and limiting data being sent or received from the mobile device while operating in energy saving mode, in an embodiment in accordance with the present invention. The service provider will receive an indication that the particular mobile device has entered an energy saving mode. The service provider will check the calling numbers before making any connection with the mobile device. If the calling number is not registered for making the emergency call to this particular mobile device then the call is blocked at the service provider side. The service provider may also check if the call being made from a registered number is really an emergency call (e.g., a call made by pressing the emergency button) and only then forward it to the receiving device. In this way, the service provider helps in rejecting unwanted calls on behalf of the mobile device and thus saves battery power.

In an example embodiment, service provider 120 receives emergency contact list 116B from energy mode software 114 executing on mobile device 102 as depicted in step 602. In one example embodiment, emergency contact list 116B is synchronized periodically between energy mode software 114 on mobile device 102 and energy mode software 128 on service provider 120. In other example embodiments, energy mode software 128 may only receive emergency contact list 116B when emergency contact list 116A is updated on mobile device 102, or as part of the notification energy mode software 128 receives when energy mode software 114 places mobile device 102 in energy saving mode.

In decision step 604, energy mode software 128 determines if mobile device 102 has entered into energy saving mode. If energy mode software 128 determines that mobile device 102 has not entered into energy saving mode ("No" branch, decision 604), energy mode software 128 continues to monitor mobile device 102 to determine if mobile device 102 has entered energy saving mode as depicted in decision step 604. If energy mode software 128 determines that mobile device 102 has entered into energy saving mode ("Yes" branch, decision 604), energy mode software 128 begins rejecting, or filtering, incoming calls and data destined to mobile device 102 to determine if the user placing the call, or sending the data, to mobile device 102 is not in emergency contact list 116B as depicted in step 606. In some example embodiments, incoming data being sent to mobile device 102 may originate from automated computing devices and/or processes.

In step 608, energy mode software 128 allows outgoing calls and data originating from mobile device 102, and destined to users in emergency contact list 116B. For example, upon receiving an incoming call or data from mobile device 102, energy mode software 128 verifies that the called number is contained in emergency contact list 116B. If the called number is contained in emergency contact list 116B, energy mode software 128 allows the call or data to be placed. If the called number is not contained in emergency contact list 116B, energy mode software 128 blocks the call or data to be placed. In other example embodiments, the outgoing call can be sent to ANY recipient as long as the user has pressed the emergency button. Stated another way, upon pressing emergency button 110, a user of mobile device 102 may call someone who is not in emergency contact list 116A or 116B (for example, a number found in a paper phone book) in the event of an emergency.

In decision step 610, energy mode software 128 determines if mobile device 102 is still in energy saving mode. If energy mode software 128 determines that mobile device 102 is no longer in energy saving mode ("No" branch, decision 610), energy mode software 128 determines if mobile device 102 has entered into energy saving mode as depicted in decision step 604. If energy mode software 128 determines that mobile device 102 is still in energy saving mode ("Yes" branch, decision 610), energy mode software 128 repeats steps 606 through 610 as depicted in FIG. 6. In other example embodiments, energy mode software 128 may periodically monitor the power level of mobile device 102 and instruct energy mode software 114 to place mobile device 102 into an energy saving mode. Upon being charged and the power level of battery 112 is greater than the determined threshold, energy mode software 114 may notify energy mode software 128 to remove any call and/or data restrictions.

FIG. 7 depicts a block diagram, generally designated 700, of components of the mobile device executing the energy mode software, in an embodiment in accordance with the present invention. It should be appreciated that FIG. 7 provides only an illustration of one implementation and does not imply any limitations with regard to the environments in which different embodiments may be implemented. Many modifications to the depicted environment may be made.

Mobile device 102 includes communications fabric 702, which provides communications between computer processor(s) 704, memory 706, persistent storage 708, communications unit 710, and input/output (I/O) interface(s) 712. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses.

Memory 706 and persistent storage 708 are computer readable storage media. In this embodiment, memory 706 includes random access memory (RAM) 714 and cache memory 716. In general, memory 706 can include any suitable volatile or non-volatile computer readable storage media.

Energy mode software 114 and emergency contact list 116A are stored in persistent storage 708 for execution by one or more of the respective computer processors 704 via one or more memories of memory 706. In this embodiment, persistent storage 708 includes a magnetic hard disk drive. Alternatively, or in addition to a magnetic hard disk drive, persistent storage 708 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

Communications unit 710, in these examples, provides for communications with other data processing systems or devices, including resources of network 118 and service provider 120. In these examples, communications unit 710 includes one or more network interface cards. Communications unit 710 may provide communications through the use of either or both physical and wireless communications links. Energy mode software 114 and emergency contact list 116A may be downloaded to persistent storage 708 through communications unit 710.

I/O interface(s) 712 allows for input and output of data with other devices that may be connected to mobile device 102. For example, I/O interface 712 may provide a connection to external devices 718 such as a keyboard, keypad, a touch screen, and/or some other suitable input device. External devices 718 can also include portable computer readable storage media such as, for example, thumb drives, portable optical or magnetic disks, and memory cards. Software and data used to practice embodiments of the present invention, e.g., energy mode software 114 and emergency contact list 116A, can be stored on such portable computer readable storage media and can be loaded onto persistent storage 708 via I/O interface(s) 712. I/O interface(s) 712 also connect to a display 720.

Display 720 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method comprising:
receiving, by one or more computer processors at a server computer of a service provider, a communication associated with a first device and a second device, wherein the second device is a sender of the communication and the first device is an intended recipient of the communication, wherein an emergency contact list of the first device includes one or more identifiers associated with one or more devices, including at least an identifier associated with a third device, wherein the identifier associated with the third device has been added to the emergency contact list by a user of the first device and confirmed by a user of the third device via a message from the third device;
determining, by the one or more computer processors at the server computer of the service provider, that the first device is operating in an energy saving mode;
determining, by the one or more computer processors at the server computer of the service provider, that a first emergency communication override feature for the first device has not been enabled, wherein determining that a first emergency communication override feature for the first device has not been enabled comprises determining that an identifier associated with the second device is not included in the emergency contact list of the first device;
responsive to determining that the first device is operating in the energy saving mode and that the first emergency communication override feature for the first device has not been enabled, determining, by the one or more computer processors at the server computer of the service provider, not to send the communication to the first device, wherein the first device is blocked from receiving any indication of the communication;
informing, by the one or more computer processors at the server computer of the service provider, the second device that the communication cannot be sent due to the first device operating in the energy saving mode;
receiving, by the one or more computer processors at the server computer of the service provider, an indication that the user of the first device has enabled a second emergency communication override feature by pressing an emergency communication override button; and
responsive to receiving the indication that the user of the first device has enabled the second emergency communication override feature, determining, by the one or more computer processors at the server computer of the service provider, to send the communication to the first device, wherein the first device is no longer blocked from receiving the communication.

2. The method of claim 1, wherein
the first device is a mobile device; and
the energy saving mode is enabled in response to the first device's battery charge falling below a predetermined threshold.

3. The method of claim 1, wherein the confirmation message from the third device is a short messaging service (SMS) message.

4. The method of claim 1, wherein receiving an indication that the user of the first device has enabled a second emergency communication override feature by pressing an emergency communication override button, further comprises:
receiving, by the one or more computer processors at the server computer of the service provider, a current location of the first device; and
receiving, by the one or more computer processors at the server computer of the service provider, a current altitude of the first device.

5. The method of claim 1, further comprising:
receiving, by the one or more computer processors at the server computer of the service provider, an identifier of the third device from the first device, based on the user providing a spoken phrase to the first device; and
in response to determining that the identifier of the third device is included in the emergency contact list of the first device, determining, by the one or more computer processors at the server computer of the service provider, to send a second communication to the third device.

6. A computer program product comprising:
one or more computer readable storage media and program instructions stored on the one or more computer readable storage media for execution by one or more processors, the program instructions comprising:
program instructions to receive, at a server computer of a service provider, a communication associated with a first device and a second device, wherein the second device is a sender of the communication and the first device is an intended recipient of the communication, wherein an emergency contact list of the first device includes one or more identifiers associated with one or more devices, including at least an identifier associated with a third device, wherein the identifier associated with the third device has been added to the emergency contact list by a user of the first device and confirmed by a user of the third device via a message from the third device;
program instructions to determine, at the server computer of the service provider, that the first device is operating in an energy saving mode;
program instructions to determine, at the server computer of the service provider, that a first emergency communication override feature for the first device has not been enabled, wherein determining that a first emergency communication override feature for the first device has not been enabled comprises determining that an identifier associated with the second device is not included in the emergency contact list of the first device;
program instructions to, responsive to determining that the first device is operating in the energy saving mode and that the first emergency communication override feature for the first device has not been enabled, determine, at the server computer of the service provider, not to send the communication to the first device, wherein the first device is blocked from receiving any indication of the communication;

program instructions to inform the second device that the communication cannot be sent due to the first device operating in the energy saving mode;

program instructions to receive an indication that the user of the first device has enabled a second emergency communication override feature by pressing an emergency communication override button; and program instructions to, responsive to receiving the indication that the user of the first device has enabled the second emergency communication override feature, determine, at the server computer of the service provider, to send the communication to the first device, wherein the first device is no longer blocked from receiving the communication.

7. The computer program product of claim 6, wherein
the first device is a mobile device; and
the energy saving mode is enabled in response to the first device's battery charge falling below a predetermined threshold.

8. The computer program product of claim 6, wherein the confirmation message from the third device is a short messaging service (SMS) message.

9. A computer system comprising:
one or more computer processors;
one or more computer readable storage media;
program instructions stored on the computer readable storage media for execution by at least one of the one or more processors, the program instructions comprising:

program instructions to receive, at a server computer of a service provider, a communication associated with a first device and a second device, wherein the second device is a sender of the communication and the first device is an intended recipient of the communication, wherein an emergency contact list of the first device includes one or more identifiers associated with one or more devices, including at least an identifier associated with a third device, wherein the identifier associated with the third device has been added to the emergency contact list by a user of the first device and confirmed by a user of the third device via a message from the third device;

program instructions to determine, at the server computer of the service provider, that the first device is operating in an energy saving mode;

program instructions to determine, at the server computer of the service provider, that a first emergency communication override feature for the first device has not been enabled, wherein determining that a first emergency communication override feature for the first device has not been enabled comprises determining that an identifier associated with the second device is not included in the emergency contact list of the first device;

program instructions to, responsive to determining that the first device is operating in the energy saving mode and that the first emergency communication override feature for the first device has not been enabled, determine, at the server computer of the service provider, not to send the communication to the first device, wherein the first device is blocked from receiving any indication of the communication;

program instructions to inform the second device that the communication cannot be sent due to the first device operating in the energy saving mode;

program instructions to receive an indication that the user of the first device has enabled a second emergency communication override feature by pressing an emergency communication override button; and program instructions to, responsive to receiving the indication that the user of the first device has enabled the second emergency communication override feature, determine, at the server computer of the service provider, to send the communication to the first device, wherein the first device is no longer blocked from receiving the communication.

10. The computer system of claim 9, wherein
the first device is a mobile device; and
the energy saving mode is enabled in response to the first device's battery charge falling below a predetermined threshold.

11. The computer system of claim 9, wherein the confirmation message from the third device is a short messaging service (SMS) message.

* * * * *